(12) United States Patent
Seeley et al.

(10) Patent No.: US 8,168,128 B2
(45) Date of Patent: May 1, 2012

(54) PLASMA REACTOR

(75) Inventors: Andrew James Seeley, Bristol (GB); Marilena Radoiu, Bristol (GB)

(73) Assignee: Edwards Limited, Crawley, West Sussex (GB)

( * ) Notice: Subject to any disclaimer, the term of this patent is extended or adjusted under 35 U.S.C. 154(b) by 701 days.

(21) Appl. No.: 12/084,189

(22) PCT Filed: Sep. 26, 2006

(86) PCT No.: PCT/GB2006/003578
§ 371 (c)(1), (2), (4) Date: Jan. 22, 2009

(87) PCT Pub. No.: WO2007/048994
PCT Pub. Date: May 3, 2007

(65) Prior Publication Data
US 2009/0165953 A1    Jul. 2, 2009

(30) Foreign Application Priority Data

Oct. 26, 2005   (GB) .................................. 0521830.0

(51) Int. Cl.
*B01J 19/08*   (2006.01)
(52) U.S. Cl. ................... 422/186; 422/186.04
(58) Field of Classification Search ............ 422/186, 422/186.04
See application file for complete search history.

(56) References Cited

U.S. PATENT DOCUMENTS

| 5,340,450 | A | | 8/1994 | Griffiths et al. |
| 6,160,031 | A | * | 12/2000 | Poree et al. ............ 522/153 |
| 2002/0050323 | A1 | | 5/2002 | Moisan et al. |
| 2003/0000823 | A1 | | 1/2003 | Uhm et al. |
| 2004/0134890 | A1 | | 7/2004 | Uhm et al. |

FOREIGN PATENT DOCUMENTS

| GB | 2 273 027 A | | 6/1994 |
| WO | WO 2004/098246 A1 | | 11/2004 |
| WO | WO 2005/079958 | * | 9/2005 |

OTHER PUBLICATIONS

United Kingdom Search Report of Application No. GB 0521830.0 mailed Mar. 31, 2006; Claims searched: All; Date of search: Mar. 30, 2006.
PCT Notification of Transmittal of the International Search Report and the Written Opinion of the International Searching Authority, or the Declaration of International Application No. PCT/GB2006/003578; Date of mailing: Jan. 19, 2007.

* cited by examiner

*Primary Examiner* — Kishor Mayekar

(57) ABSTRACT

A plasma reactor (10) comprises a microwave resonant cavity (12) having a gas inlet (18) and a gas outlet (20), a waveguide (14) for conveying microwave radiation to the resonant cavity, and a plasma torch (40) for injecting into the resonant cavity a plasma stream containing ions for reacting with a gas flowing from the gas inlet (18) to the gas outlet (20).

10 Claims, 3 Drawing Sheets

PLASMA REACTOR

FIELD OF INVENTION

The present invention relates to a plasma reactor. The apparatus finds particular use in a plasma abatement system, although the invention is not limited to such systems.

BACKGROUND OF THE INVENTION

A primary step in the fabrication of semiconductor devices is the formation of a thin film on a semiconductor substrate by chemical reaction of vapour precursors. One known technique for depositing a thin film on a substrate is chemical vapour deposition (CVD). In this technique, process gases are supplied to a process chamber housing the substrate and react to form a thin film over the surface of the substrate. Examples of gases supplied to the process chamber to form a thin film include, but are not restricted to:

Silane and ammonia for the formation of a silicon nitride film;
Silane, ammonia and nitrous oxide for the formation of a SiON film;
TEOS and one of oxygen and ozone for the formation of a silicon oxide film; and
$Al(CH_3)_3$ and water vapour for the formation of an aluminium oxide film.

Plasma etching processes are typically also performed in the process chamber to etch circuit features. Etching gases are typically perfluorocompound gases such as $CF_4$, $C_2F_6$, $CHF_3$, $NF_3$ and $SF_6$.

The inside surface of the process chamber is also regularly cleaned to remove the unwanted deposition material from the chamber. One method of cleaning the chamber is to supply a perfluorocompound cleaning gas such as $NF_3$ or $C_2F_6$ to react with the unwanted deposition material.

A process tool typically has a plurality of process chambers, each of which may be at respective different stage in a deposition, etching or cleaning process, and so the gas being exhaust from the chambers at any given time may have various different compositions. During these processes, there is typically a residual amount of the gas supplied to the process chamber contained in the gas exhaust from the process chamber. Gases such as silane, and ammonia are highly dangerous if exhausted to the atmosphere, and perfluoro-compounds are greenhouse gases. In view of this, before the exhaust gas is vented to the atmosphere abatement apparatus is often provided to treat the exhaust gas. The abatement apparatus converts the more hazardous or undesirable components of the exhaust gas into species that can be readily removed from the exhaust gas, for example by conventional scrubbing, and/or can be safely exhausted to the atmosphere.

Silane, ammonia and perfluorocompounds (PFCs) such as $NF_3$ and $C_2F_6$ can be removed from the gas stream with high efficiency using a microwave plasma abatement device. An example of a microwave plasma reactor is described in UK Patent no. GB 2,273,027. In that device, a waveguide conveys microwave radiation from a microwave generator into a resonant cavity housing two electrodes in a closely opposed relationship. A gas to be treated flows into the cavity through a gas inlet, and passes between the electrodes; so that a microwave plasma is initiated and sustained between the two electrodes from the gas flowing between the electrodes. One of the electrodes has an axial hole to provide a gas outlet from the resonant cavity. Under the intensive conditions within the plasma, species within the gas stream are subjected to impact with energetic electrons causing dissociation into reactive species that can combine with oxygen or hydrogen to produce relatively stable by-products. For example, $C_2F_6$ can be converted into CO, $CO_2$ and HF, which can be removed in a further treatment step, and $SiH_4$ can be converted into $SiO_2$.

A microwave plasma abatement device may therefore be connected to the exhaust from each process chamber of the tool to treat the gas streams exhaust from the process tool, each device having its own microwave generator. However, as the gas streams exhausted from the process chambers typically have a relatively high flow rate, the microwave power required to both initiate the plasma and maintain an acceptable destruction and removal efficiency (DRE) tends to be relatively high, typically between 3 and 6 kW. Therefore, the costs associated with the microwave plasma abatement device tend to be relatively high.

As an alternative to using microwave plasma abatement devices, a dc plasma torch abatement device may be used to treat each gas stream exhaust from the process tool. As is known, a dc plasma torch creates a plasma flame from an inert, ionisable gas such as argon conveyed between the electrodes of the torch. The gas stream and a suitable source of hydrogen and oxygen can be conveyed into the plasma flame to react to form the relatively stable by-products mentioned above. Plasma torch abatement devices are relatively cheap in comparison to microwave plasma abatement devices, and are relatively cheap to operate, for example as a plurality of torches may be operated from a single dc power supply. However, the abatement performance for cleaning gases such as fluorocarbons and $NF_3$ tends to be relatively low in comparison to that of microwave plasma abatement devices.

It is an aim of at least the preferred embodiments of the present invention to provide a plasma reactor that can combine the relatively high destruction efficiency of a microwave plasma abatement device with the low cost associated with a plasma torch abatement device.

SUMMARY OF THE INVENTION

The present invention provides a plasma reactor comprising a microwave resonant cavity having a gas inlet and a gas outlet, a waveguide for conveying microwave radiation to the resonant cavity, and a plasma torch for injecting into the resonant cavity a plasma stream containing ions for reacting with a gas flowing from the gas inlet to the gas outlet.

The present invention also provides apparatus for treating a gas stream exhaust from a process tool, the apparatus comprising a plasma reactor as aforementioned. The present invention further provides a plasma abatement device comprising a microwave resonant cavity having a gas inlet and a gas outlet, a waveguide for conveying microwave radiation to the resonant cavity, and a plasma torch for injecting into the resonant cavity a plasma stream containing ions for reacting with a gas flowing from the gas inlet to the gas outlet.

BRIEF DESCRIPTION OF THE DRAWINGS

Preferred features of the present invention will now be described, by way of example only, with reference to the accompanying drawings, in which.

DETAILED DESCRIPTION OF THE INVENTION

Figure 1:
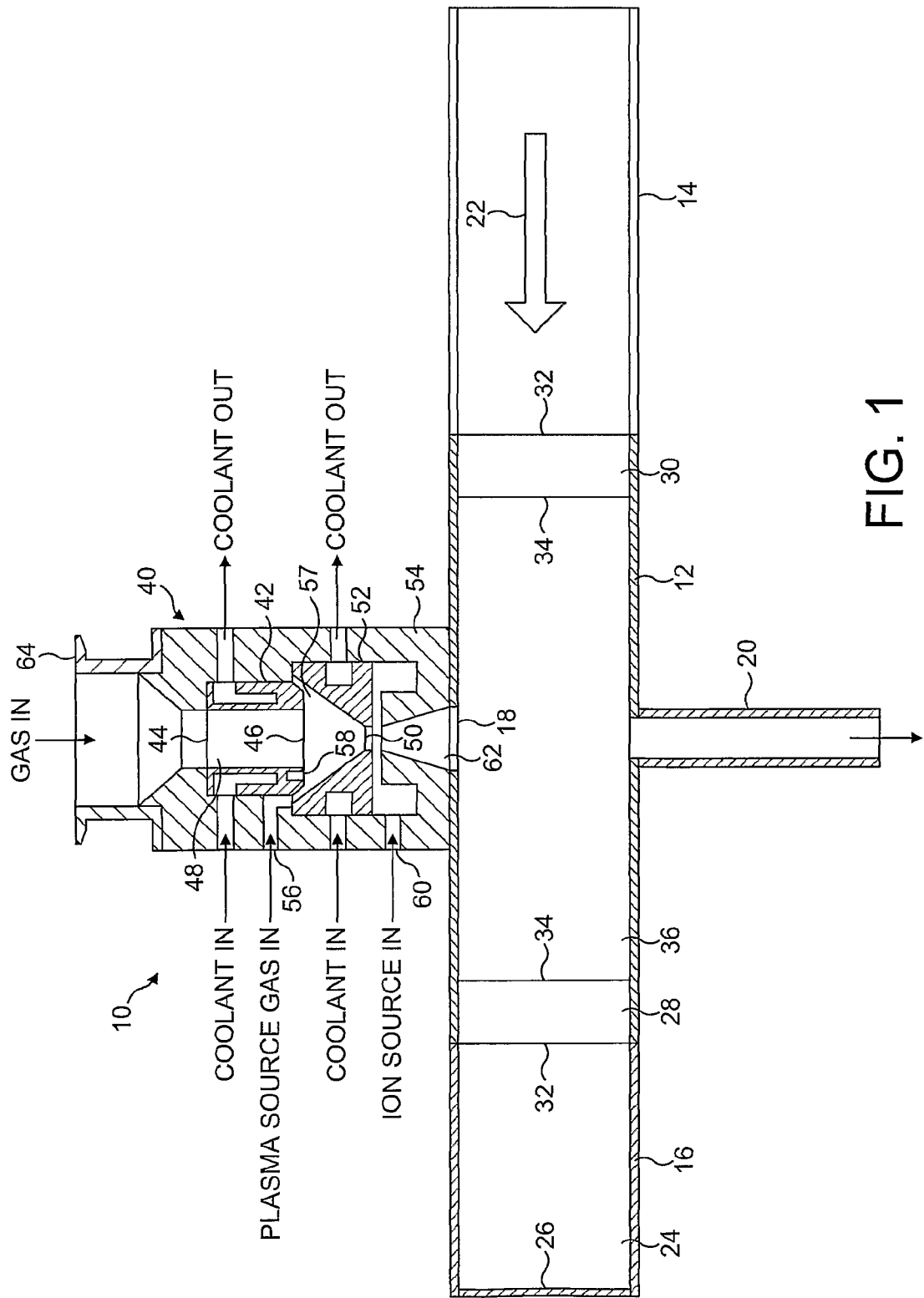
FIG. 1 is a cross-section side view of a first embodiment of a plasma reactor.

The present invention provides a plasma reactor comprising a microwave resonant cavity having a gas inlet and a gas outlet, a waveguide for conveying microwave radiation to the resonant cavity, and a plasma torch for injecting into the resonant cavity a plasma stream containing ions for reacting with a gas flowing from the gas inlet to the gas outlet.

The action of the microwaves on the plasma stream injected into the cavity by the plasma torch can significantly enhance the reactivity of the plasma stream produced by the plasma torch, such that the DRE of perfluorocompounds is comparable to that of a microwave abatement device. We have found that the microwave power required enhance the reactivity of the plasma stream to this level can be less than 1 kW for a gas stream exhaust from a chamber of a process tool, and the microwaves can be generated using a relatively low cost microwave generator.

In one embodiment, the plasma torch comprises means for generating the plasma stream from a plasma source gas, and means for conveying to the plasma stream a source of said ions for impinging upon the plasma stream to form said ions. The ions may comprise heated OH⁻ and/or H⁺ ions. By forming heated OH⁻ and/or H⁺ ions from a suitable source thereof, such as water or an alcohol, for subsequent reaction with the gas flowing through the resonant cavity, it has been found that the enemy required to cause the destruction of the gas can be reduced, and the efficiency of that destruction can be radically improved.

A relatively cheap and readily available fluid, such as water vapour or a fuel, for example hydrogen, hydrocarbon or an alcohol, can be used to generate $H^+$ and/or $OH^-$ ions, and that the reaction can take place at any convenient pressure, for example, around or below atmospheric pressure. Examples of a suitable alcohol include methanol, ethanol, propanol, propan-2-ol and butanol. Other examples of a source of $H^+$ ions include hydrogen, a hydrocarbon, ammonia and a paraffin.

In one embodiment, the plasma torch is arranged to inject the ions into the resonant cavity through the gas inlet. In this embodiment, the plasma torch may comprise means for receiving the gas, and means for conveying the gas to the plasma stream for injection into the resonant cavity with the ions.

The plasma stream may be injected into the resonant cavity separately from the gas, and so in another embodiment the resonant cavity comprises a further inlet through which the plasma stream is injected into the resonant cavity. The resonant cavity may be provided with multiple inlets for receiving respective gases, for example from respective process chambers, and/or for receiving a plasma stream from a respective plasma torch.

The resonant cavity may be a multimode or a mono-mode resonant cavity. If the cavity is a mono-mode cavity, the reactor is provided with means for forming an electromagnetic standing wave within the resonant cavity. The or each plasma torch is preferably located such that the plasma stream is injected into the cavity at a location at which the intensity of the electric field within the cavity is at a peak, thereby maximising the enhancement of the reactivity of the plasma stream.

If the cavity is a multi-mode cavity, in which the intensity of the electric field is roughly uniform within the cavity, the plasma torch can be located at any convenient position.

The present invention also provides apparatus for treating a gas stream exhaust from a process tool, the apparatus comprising a plasma reactor as aforementioned. The present invention further provides a plasma abatement device comprising a microwave resonant cavity having a gas inlet and a gas outlet, a waveguide for conveying microwave radiation to the resonant cavity, and a plasma torch for injecting into the resonant cavity a plasma stream containing ions for reacting with a gas flowing from the gas inlet to the gas outlet.

With reference to FIG. 1, a plasma reactor 10 comprises an electrically conducting resonant cavity 12. In this embodiment, the resonant cavity is a mono-mode resonant cavity, operating in $TE_{01}$ mode. One end of the resonant cavity 12 is connected to a waveguide 14 for conveying microwave radiation from a microwave generator (not shown) into the resonant cavity 12. The other end of the resonant cavity 12 is connected to a short circuit 16. The resonant cavity has a gas inlet 18 and a gas outlet 20, which, in this embodiment, are both arranged orthogonal to the direction of propagation of the microwaves through the resonant cavity 12, as indicated by arrow 22 in FIG. 1.

The short circuit 16 provides an extension of the waveguide 14 on the opposite side of the resonant cavity 12. The short circuit 16 comprises a chamber 24 defined in part by an end plate 26 that is distanced from the end of the waveguide 14 so that the incident microwave radiation is reflected by the end plate 26 to form an electromagnetic standing wave within the resonant cavity 12. The position of the end plate 26 relative to the end of the waveguide 14 may be adjustable.

The resonant cavity 12 houses two dielectric plate members 28, 30, preferably formed from PTFE or other suitable material for retaining adequate corrosion resistance whilst being substantially transparent to the microwave radiation conveyed through the resonant cavity 12. Each plate member 28, 30 preferably has a first sidewall portion 32 extending orthogonally to the direction of propagation of the microwave radiation through the resonant cavity 12, and a second sidewall portion 34 which defines in part a gas chamber 36 within the resonant cavity 12. The gas chamber 36 may have any desired cross-section.

In use, microwave radiation is fed into the resonant cavity 12, and thus into the gas chamber 36, from a microwave generator by the waveguide 14. The generator generates microwave radiation with a relatively low power, preferably less than 2 kW, more preferably less than 1 kW. The end plate 26 of the short circuit 16 reflects the microwaves to form a standing wave within the resonant cavity 12, the electromagnetic field within the resonant cavity 12 having a maximum located between the gas inlet 18 and the gas outlet 20.

The reactor 10 further comprises a dc plasma torch 40 for injecting into the resonant cavity 12 a plasma stream containing ions or radicals for reacting with a gas flowing between the gas inlet 18 and the gas outlet 20. The plasma torch 40 comprises a tubular cathode, or electron emitter, 42 having a first open end 44 and a second open end 46. A water coolant is conveyed about the electron emitter 42. The bore 48 of the electron emitter 42 is aligned with a nozzle 50 formed in a start anode or electrode 52 surrounding the second open 46 of the electron emitter 42. The start electrode 52 is mounted in an insulating block 54 surrounding the electron emitter 42, in which coolant inlets and outlets are formed for supplying a water coolant to and from the electron emitter 42 and the start electrode 52.

The plasma torch 40 has a first gas inlet 56 for receiving a stream of an ionisable plasma source gas, for example argon or nitrogen, which enters a cavity 57 located between the electron emitter 42 and the start electrode 52. In use, a pilot arc is first generated between the electron emitter 42 and the start electrode 52 by supplying a high frequency, high voltage signal to a hafnium insert 58. The pilot arc thus formed between the electrode emitter 42 and the start electrode 52 ionises the plasma source gas entering the cavity 57 from the first gas inlet 56 to produce a high momentum plasma flame or stream of ionised source gas from the tip of the nozzle 50.

The plasma torch 40 further includes a second gas inlet 60 for receiving a stream of an ion source, for example water vapour. The water is conveyed from the second gas inlet 60 to a plasma region 62 located beneath the nozzle 50, so that the water is decomposed by the plasma stream to form H+ and OH− ions that become entrained within the plasma stream.

In this embodiment, the plasma torch 40 is arranged to inject the plasma stream into the resonant cavity 12 through the gas inlet 18 of the resonant cavity 12. The plasma torch 40 includes a third gas inlet 64 for receiving the gas to be treated within the reactor 10 by reaction with the ions entrained within the plasma stream. The third gas inlet 64 is located substantially co-axially with the electrode emitter 42 and start electrode 52 to convey the gas into the bore 48 of the electrode emitter 42 through the first open end 44 of the electrode emitter 42. The gas passes from the second open end 46 of the electrode emitter 42 into the plasma region 62 so that the gas mixes with the plasma source gas within the cavity 57 and is emitted from the plasma torch 40 with the plasma stream through the gas inlet 18 into the resonant cavity 12. The standing wave formed within the resonant cavity 12 by the microwave radiation enhances the reaction of the gas to be treated with the ions within the plasma stream so that the gas is destroyed with high destruction and removal efficiency (DRE).

The reactor 10 may be used as an abatement device to treat, a gas stream exhaust from a process chamber of a process tool, for example for the manufacture of semiconductors or flat panel display devices. Such a process tool may have a plurality of process chambers, and in this case a plurality of plasma reactors 10 may be provided, each for treating gas exhaust from a respective process chamber. However, costs may be reduced by providing a plasma reactor 10 that is configured to simultaneously treat two or more gas streams. Examples of such a plasma reactor will now be described.

Figure 2:
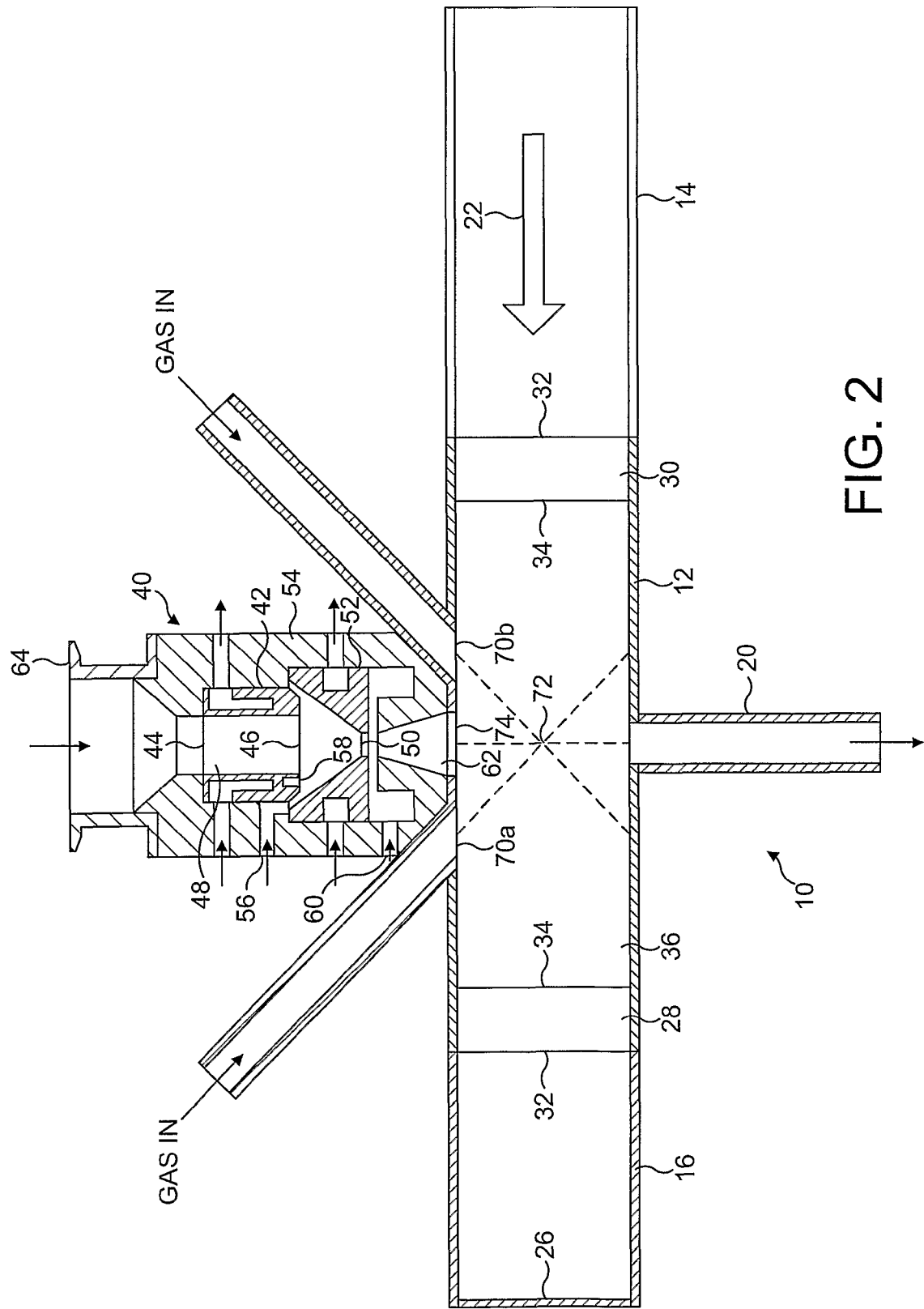
FIG. 2 is a cross-section side view of a second embodiment of a plasma reactor.

In the second embodiment illustrated in FIG. 2, the plasma reactor 10 is configured to treat at least two gas streams, for example, from respective process chambers. Two gas streams are each conveyed into the resonant cavity 12 through a respective gas inlet 70a, 70b. As illustrated in FIG. 2, these gas inlets 70a, 70b are arranged so that the gas streams converge at a point 72 located directly below a further inlet 74 through which a plasma stream is injected into the resonant cavity 12. As in the first embodiment described above, a third gas stream may be conveyed to the third gas inlet 64 of the plasma torch 40 for injection into the resonant cavity 12 with the plasma stream. Alternatively, the ion source may be conveyed to the third gas inlet 64 to form ions that become entrained within the plasma stream.

Figure 3:
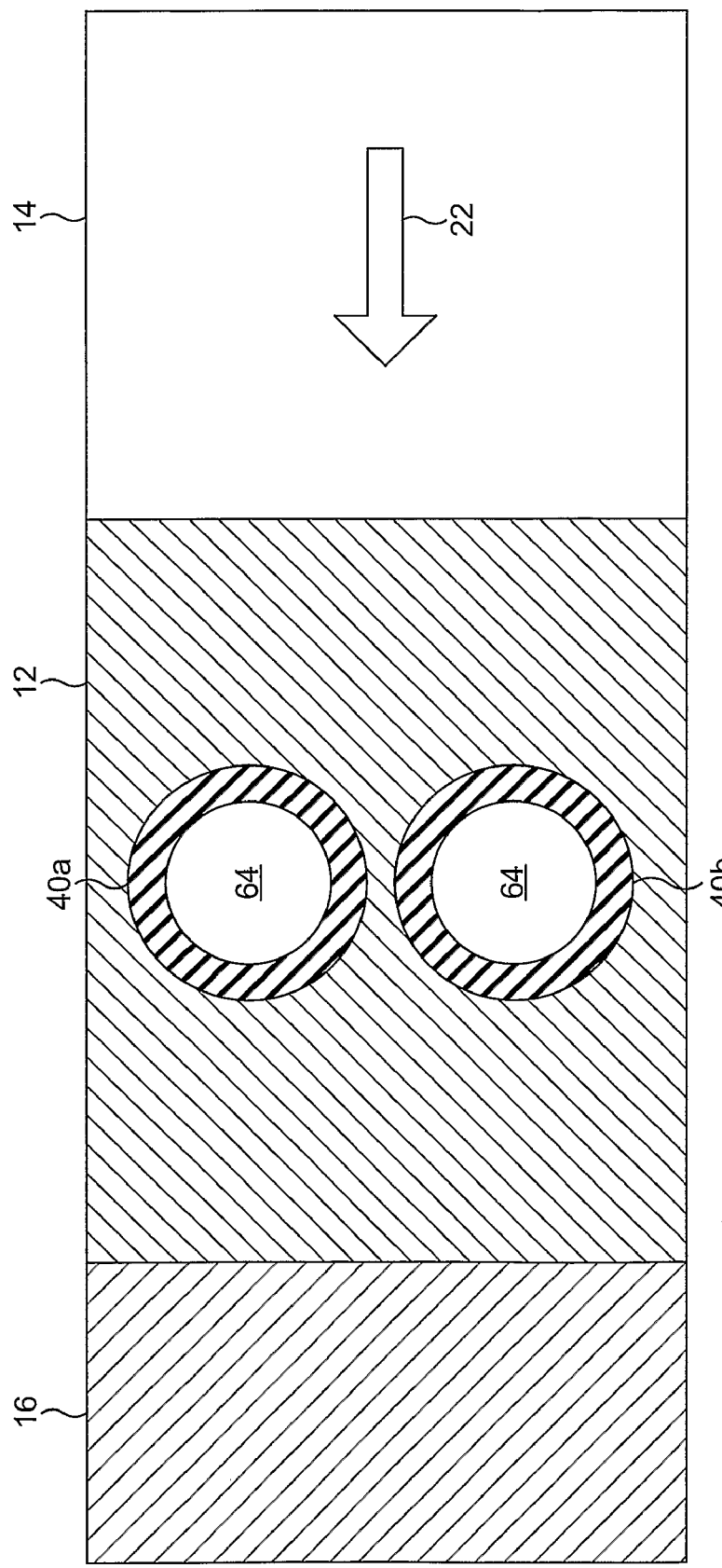
FIG. 3 is a top view of a third embodiment of a plasma reactor.

In the third embodiment illustrated in FIG. 3, the plasma reactor 10 comprises a plurality of plasma torches 40a, 40b. Each of these plasma torches is similar to the plasma torch 40 of the first embodiment, so that each of the plasma torches 40a, 40b has a first gas inlet for receiving a stream of an ionisable plasma source gas, a second gas inlet for receiving a stream of an ion source, and a third gas inlet 64 for receiving a respective gas stream to be treated. The torches 40a, 40b are arranged such that the plasma streams, with gas and reactive ions entrained therein, enter the resonant cavity 12 through a respective gas inlet (not shown) substantially at a maximum of the electric field of the standing wave generated within the resonant cavity. The resonant cavity 12 may have a single gas outlet, or a plurality of gas outlets, each located beneath a respective gas inlet of the resonant cavity 12.

In another embodiment, the plasma reactor 10 of the third embodiment may be provided with further gas inlets similar to the gas inlets 70a, 70b of the second embodiment each for conveying gas into one of the plasma streams entering the resonant cavity 12.

In the above embodiments, the resonant cavity 12 operates in $TE_{01}$ mode. However, the cavity 12 may be arranged to operate in an alternative mono-mode or in a multi-mode manner. By arranging the cavity 12 to operate in a multi-mode manner, rather like a microwave oven so that the intensity of the microwave electric field is substantially uniform throughout the resonant cavity 12, there is greater freedom of choice for the location of one or more plasma torches relative to the resonant cavity 12.

While the foregoing description and drawings represent the preferred embodiments of the present invention, it will be apparent to those skilled in the art that various changes and modifications may be made therein without departing from the true spirit and scope of the present invention.

We claim:

1. A plasma reactor comprising:
   a microwave resonant cavity having a gas inlet and a gas outlet;
   a waveguide for conveying microwave radiation to the resonant cavity; and
   a plasma torch for injecting into the resonant cavity a plasma stream containing ions for reacting with a gas to be treated flowing from the gas inlet to the gas outlet
   wherein the plasma torch is adapted to receive the gas to be treated, and convey the gas to be treated to the plasma stream for injection into the microwave resonant cavity with the ions.

2. The reactor according to claim 1 wherein the plasma torch comprises an anode and a cathode for generating the plasma stream from a plasma source gas, and an ion source inlet for conveying to the plasma stream a source of said ions for impinging upon the plasma stream to form said ions.

3. The reactor according to claim 1 wherein the resonant cavity comprises a plasma stream inlet through which the plasma stream is injected into the resonant cavity.

4. The reactor according to claim 3 wherein the resonant cavity comprises a plurality of plasma stream inlets, the reactor comprising a plurality of plasma torches each arranged to inject a plasma stream into the resonant cavity through a respective plasma stream inlet.

5. The reactor according to claim 1 wherein the resonant cavity comprises a plurality of gas inlets through which respective gas streams enter the resonant cavity.

6. The reactor according to claim 1 wherein the resonant cavity is a mono-mode resonant cavity, the reactor comprising the waveguide and an end plate for forming an electromagnetic standing wave within the resonant cavity.

7. The reactor according to claim 6 wherein the plasma torch is positioned such that the plasma stream is injected therefrom into the cavity substantially at a maximum of the electric field of the electromagnetic standing wave.

8. The reactor according to claim 1 wherein the resonant cavity is a multi-mode resonant cavity.

9. The reactor according to claim 1 wherein the microwave radiation has a power of less than 2 kW.

10. The reactor according to claim 1 wherein the microwave radiation has a power of less than 1 kW.

* * * * *